United States Patent [19]

Nishi

[11] Patent Number: 4,856,905
[45] Date of Patent: Aug. 15, 1989

[54] PROJECTION EXPOSURE APPARATUS
[75] Inventor: Kenji Nishi, Kawasaki, Japan
[73] Assignee: Nikon Corporation, Tokyo, Japan
[21] Appl. No.: 192,684
[22] Filed: May 10, 1988
[30] Foreign Application Priority Data
  May 14, 1987 [JP] Japan .................. 61-115942
[51] Int. Cl.$^4$ .............................. G01B 11/00
[52] U.S. Cl. ...................... 356/401; 250/548
[58] Field of Search ............ 356/399, 400, 401; 250/548, 557, 561

[56] References Cited
U.S. PATENT DOCUMENTS
  4,795,244  1/1989  Uehara et al. ............ 356/401
  4,798,962  1/1989  Matsumoto et al. ........ 250/548

Primary Examiner—F. L. Evans
Attorney, Agent, or Firm—Shapiro and Shapiro

[57] ABSTRACT

A projection exposure apparatus capable of improving the precision of baseline measurement has an objective optical system whose chromatic aberration has been corrected for a first wavelength and a second wavelength and which is used for introducing the lights of first and second wavelengths into an imaging optical system through a mask, a first illuminating system for focusing the light of the first wavelength at a plane of the mask and a plane of a substrate through the objective optical system, a second illuminating system for focusing the light of the second wavelength at a plane of the mask and a plane of the substrate through the objective optical system, and deflecting means for commonly deflecting the lights of first and second wavelengths entering the objective optical system in such a manner that the lights of first and second wavelengths respectively scan alignment marks formed on the mask and substrate at the same time.

4 Claims, 4 Drawing Sheets

PROJECTION EXPOSURE APPARATUS

BACKGROUND OF THE INVENTION

1. Field of the Invention

The present invention relates to alignment in a projection exposure apparatus, and more particularly to baseline measurement in case of an alignment operation through a projection optical system with light of a wavelength different from that of the light for exposure.

2. Related Background Art

For alignment of a mask and a substrate in conventional projection exposure apparatus, there is already known a method of projecting light for alignment of a wavelength different from that of light for exposure onto the mask and the substrate through a projection optical system, thereby achieving relative alignment of said mask and substrate.

However, the lights of different wavelengths, such as the light for exposure and that for alignment, will have different focus positions when projected the projection optical system due to the color aberration. Consequently the exposure based on the positional information detected with the aligning light will involve a positional aberration corresponding to said color aberration.

Following methods have been proposed to avoid this drawback.

FIG. 1 illustrates an apparatus for avoiding this drawback, in which the error in focus position (or baseline) on the substrate (for example semiconductor wafer) with respect to the mask (or reticle) for the aligning light and the exposing light is measured in advance, and said error is eliminated in the alignment operation.

Referring to FIG. 1, light LA of exposing wavelength emitted from a light source 200 through an optical fiber 202 is transmitted through a lens 204, then enters and is reflected by a half mirror 206, transmitted through a lens 208, reflected by a mirror 210 and illuminates a reticle R bearing a first reticle mark $RM_1$.

The light LA transmitted through the reticle R illuminates, through a reducing projection lens 212, a wafer W placed on a stage 214. At the side of the stage 214 there is provided an interferometer 215 for monitoring the position of the stage 214.

The stage 214 is provided, at the same height as that of the surface of the wafer W, with a fiducial mark FM is composed, for example, of a chromium pattern formed on a glass plate, and allows observation of the mark with a high contrast.

The light reflected from the wafer W (or fiducial mark FM) travels back the same path as that of the illuminating light and enters the half mirror 206. It is then transmitted through the half mirror 206 and a lens 216 and is received by a detector 218. For the light LA of exposing wavelength, the reticle R and the wafer W are mutually conjugate with respect to the projection lens 212, so that the light from the reticle R and that from the wafer W are simultaneously focused on the detector 218 and observed.

On the other hand, aligning light LB, from an unrepresented light source, of a wavelength different from that of the exposing light is transmitted through a lens 220, then reflected by a mirror 222 and illuminates a second reticle mark $RM_2$ on the reticle R. The aligning light LB transmitted through the reticle R is transmitted by a correction lens 224 and the reducing projection lens 212, and illuminates, as a light spot, a wafer mark WM (not shown) on the wafer W.

The baseline measurement is conducted by illuminating, with the light LA of exposing wavelength, the first reticle mark $RM_1$ on the reticle R and the fudicial mark FM through the projection lens 212. Then the stage 214 is so moved that the images of the reticle mark $RM_1$ and the fiducial mark FM, simultaneously observed by the detector 218, mutually coincide, and the illuminating position of the light transmitted through the first reticle mark $RM_1$ is determined by calculating the measurement with the interferometer 215 or the signal from the detector 218.

Then the reticle R and the fiducial mark FM are illuminated by the aligning light LB in the same manner as with the exposing light LA, and the stage 214 is moved to align the second reticle mark $RM_2$ with the fiducial mark FM. Subsequently the illuminating position of the light transmitted through the second reticle mark $RM_2$ is measured with the interferometer 215.

The distance (baseline) between the illuminating position of the light LA of exposing wavelength and that (focus position) of the aligning light LB on the wafer W with respect to the reticle R is measured by the interferometer 215, from two positional information detected as explained above.

Subsequently the alignment operation is conducted with the aligning light LB, with the correction of distance of the light LA of exposing wavelength and the aligning light LB on the wafer obtained above.

In the above-explained conventional baseline measuring technology, the precision of measurement is inevitably deteriorated because of the use of different marks (first reticle mark $RM_1$ and second reticle mark $RM_2$), because the measurements with different wavelengths are conducted at different timings, and because the hardware sequence is different for the aligning systems of both wavelengths.

Such deterioration in the precision of baseline measurement results in an offset error giving rise to the deterioration of precision of alignment itself.

SUMMARY OF THE INVENTION

The object of the present invention is to provide a projection exposure apparatus capable of improving the precision of baseline measurement thereby achieving highly accurate alignment.

The foregoing object can be achieved according to the present invention by a projection exposure apparatus which is featured by an objective optical system whose chromatic aberration is corrected for a first wavelength and a second wavelength and which is used for introducing the lights of first and second wavelengths into an imaging optical system through a mask; a first illuminating system for focusing the light of said first wavelength at a plane of said mask and a plane of a substrate through said objective optical system; a second illuminating system for focusing the light of said second wavelength at a plane of said mask and a plane of said substrate through said objective optical system; and deflecting means for commonly deflecting said lights of first and second wavelengths entering said objective optical system in such a manner that said lights of first and second wavelengths respectively scan alignment marks formed on said mask and substrate at the same time.

In the present invention, the exposing light of a first wavelength and the light of another wavelength are focused at a same position on the mask and the substrate and are made to scan the alignment marks formed on said mask and substrate, so that there can be eliminated errors resulting from vibration of mask or substrate, or from the difference in the timing of measurement, and highly precise baseline measurement can be achieved within a short time by a single scanning.

DETAILED DESCRIPTION OF THE PREFERRED EMBODIMENTS

Figure 2:
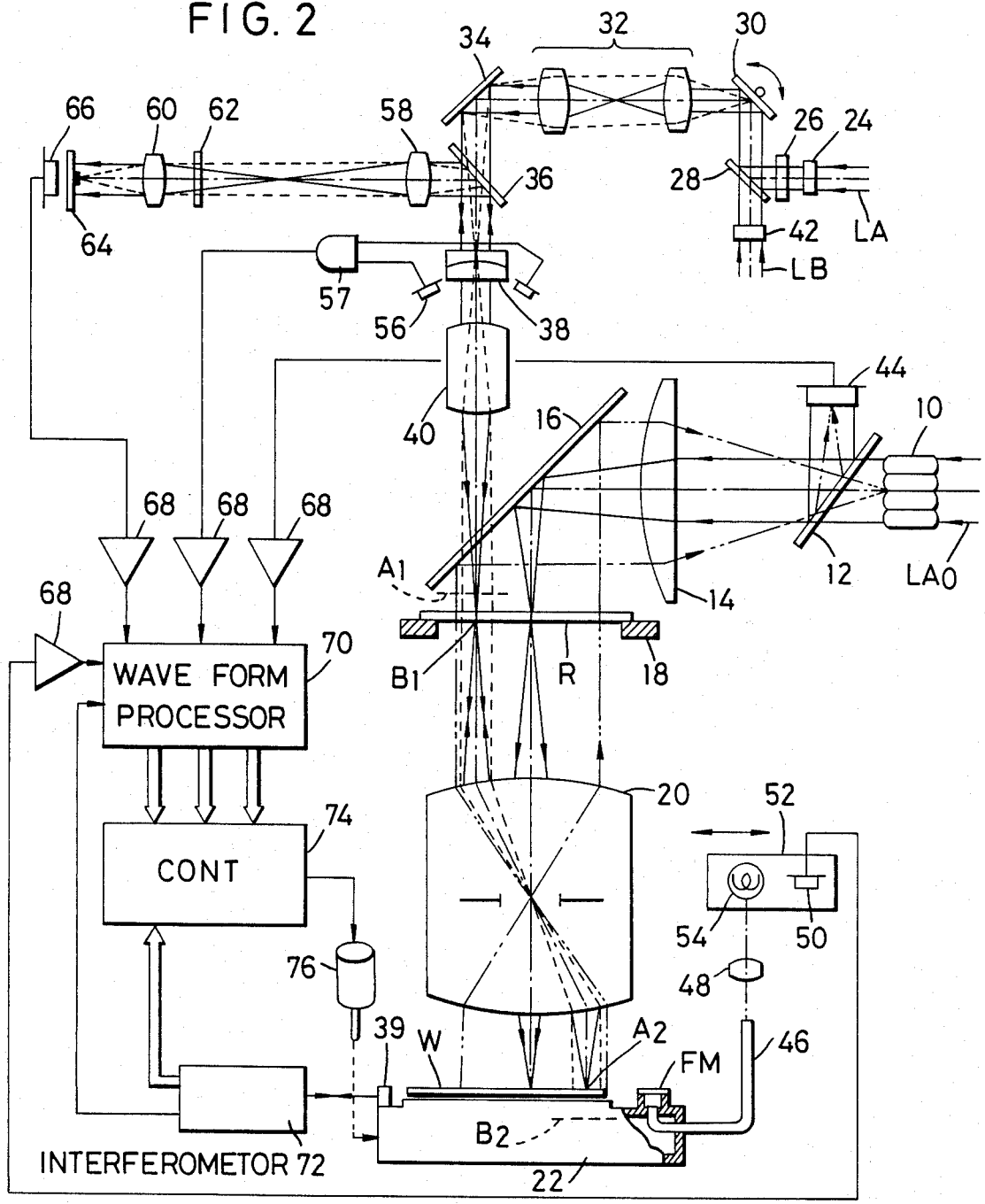
FIG. 2 is a schematic view of an apparatus constituting a firs embodiment of the present invention.

FIG. 2 illustrates the structure of a first embodiment of the present invention.

At first there will be explained the exposure system. An exposing light $LA_0$ from an urepresented light source is transmitted through a fly-eye lens 10 and a half mirror 12 of low reflective factor in comparison with transmission factor, then condensed by a condenser lens 14, reflected by a dichroic mirror 16 and enters a reticle R placed on a reticle stage 18. The dichroic mirror 16 reflects about 95% of the light of said exposing wavelength.

The exposing light $LA_0$ transmitted by through reticle R enters a wafer W placed on a wafer stage 22 through a projection lens 20, thus projecting a circuit pattern formed on the reticle R onto the wafer W.

Then there will be explained the alignment system. A light beam LA of a wavelength same as that of the exposing light $LA_0$, emitted from an unrepresented light source and then collimated, is transmitted through a cylindrical lens 24 and a polarizing plate 26, then reflected by a dichroic mirror 28 and enters a scanner 30. The polarizing plate 26 is provided for linearly polarizing the light beam LA into a polarization characteristic (P or X polarized component) which has a higher transmission factor through the dichroic mirror 16.

The light beam LA is then reflected by the scanner 30, then guided through a relay system 32 and a mirror 34 and enters a beam splitter 36. The scanner 30 is provided at the pupil position and is adapted to move the reflected light as a light spot in the focus position.

Figure 1:
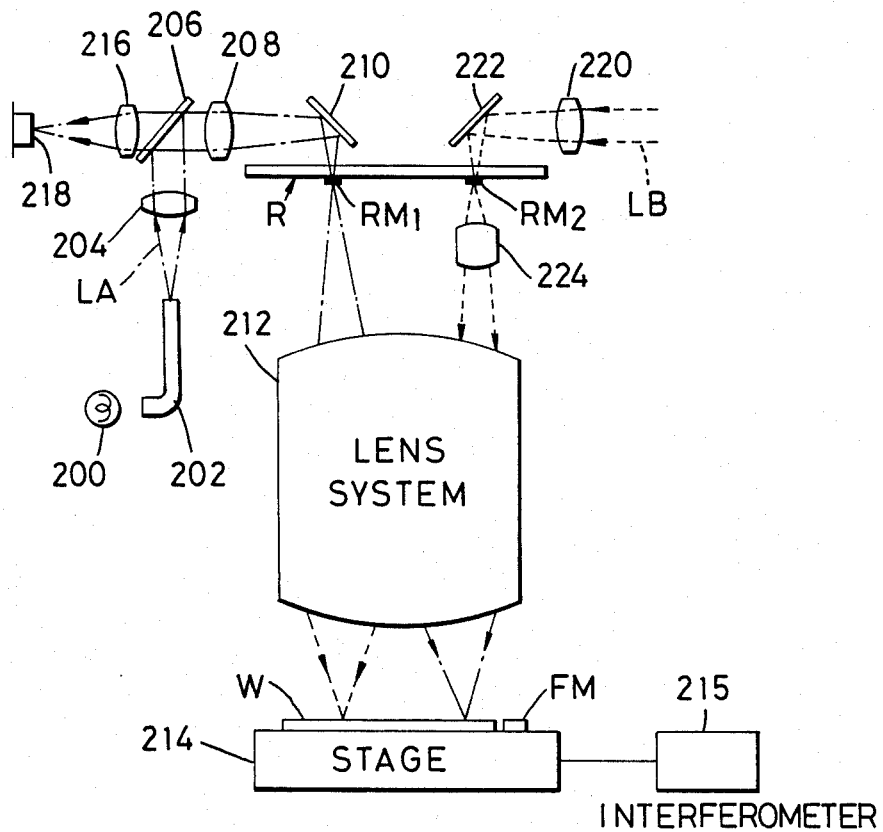
FIG. 1 is a schematic view of a conventional apparatus.
Figure 3:
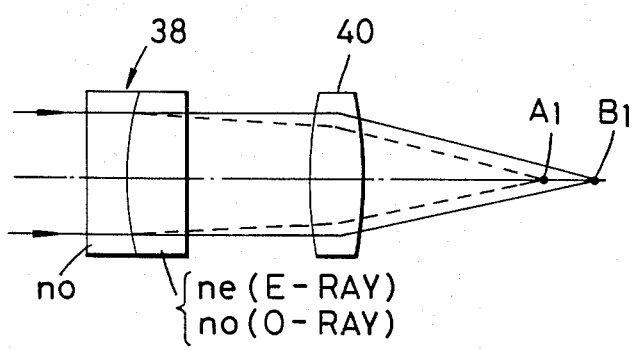
FIG. 3 is a schematic view of a double focus element.

The light beam LA transmitted through the beam splitter 36 is guided through a double focus element 38 utilizing double refraction and an objective lens 40, and enters the above-mentioned dichroic mirror 16. The double focus element 38 is disclosed in the U.S. patent application Ser. No. 76,740 of the present applicant, and is composed for example, as shown in FIG. 3, of an element of a crystal showing a refractive index $n_o$ for ordinary ray and a refractive index $n_e$ for extraordinary ray, and an element of ordinary glass bonded to the crystal element and having a refractive index $n_o$. Also the objective lens 40 is one whose chromatic aberration has been corrected for both the exposing wavelength and the wavelength of the aligning light LB different from said exposing wavelength.

The light beam LA transmitted through the dichroic mirror 16 enters the reticle R, and the light beam transmitted therethrough illuminates the wafer W through the projection lens 20. The reticle R is provided with a reticle mark RM for alignment (not shown), and the wafer stage 22 is provided, at a suitable corner thereof, with a fiducial mark FM with an aperture, at a plane corresponding to the surface of the wafer W. The wafer stage 22 is provided, at the end thereof, with a movable mirror 39 for position detection. The light beam LA, being of a wavelength same as that of the exposing light, is focused on a pattern-bearing lower face B1 of the reticle R, and is focused again on a face A2 of the wafer W.

In the following there will be explained the paths of light for detecting the reticle mark RM on the reticle R and the fiducial mark FM formed at the position of surface of the wafer W.

The detected light (normal reflected light) generated from the reticle mark RM by the function of the scanner 30 is reflected by the dichroic mirror 16, then transmitted through the condenser lens 14, reflected by the half mirror 12 and enters a detector 44.

On the other hand, the light beam LA which is transmitted through the glass of the reticle R and illuminates the fiducial mark FM on the wafer stage 22 enters the aperture of said fiducial mark FM, then travels through a fiber 46 and a lens 48 and enters a detector 50, which is changeable over to a light source 54 by means of a selector 52. The light source 54, emitting light of a wavelength same as that of the exposing light, is used for emitting light from the fiducial mark FM in measuring the distortion etc. of the projection lens 20 in combination with the detector 44.

In the following there will be explained the path of the aligning light LB. The aligning light LB, having a wavelength different from that of the exposing light, is emitted from an unrepresented light source, transmitted through a cylindrical lens 42 and enters the dichroic mirror 28.

After passing through the dichroic mirror 28, the aligning light LB reaches the wafer W through a path same as that of the light beam LA.

Having a wavelength different from the exposing wavelength of the light beam LA, the light beam LB is focused, after passing the double focus element 38 and the objective lens 40, in two positions at the planes A1 and B1, and again focused at the planes A2, B2 which respectively conjugate with the planes A1, B1. Consequently, in the present embodiment, the double focus element 38 and the objective lens 40 constitute the objective optical system of the present invention.

In the following there will be explained the paths of light detecting the reticle mark RM of the reticle R and the fiducial mark FM.

As explained in the foregoing, the aligning light LB is split, upon passing the double focus element 38, into two beams of mutually different polarization characteristics, one being focused on the pattern-bearing surface B1 of the reticle R while the other being focused on the surface A2 of the wafer W.

The light beam focused on the reticle mark RM is scattered at the edges thereof by the function of the scanner 30, and thus obtained scattered light is transmitted through the dichroic mirror 16 and the objective lens 40 and enters detectors 56 provided at two positions around the double focus element 38. An adder 57 determines the sum of the amount of received light.

On the other hand, the light beam focused on the fiducial mark FM at the surface position of the wafer W is scattered at the edges of said mark, and the obtained scattered light is again guided through the projection lens 20, reticle R, dichroic mirror 16, objective lens 40 and double focus element 38, and enters the beam splitter 36. Said light is deflected by the beam splitter 36, then guided through relay lenses 58, 60, a polarizer 62 and a spatial filter positioned conjugate to the pupil and is received by a detector 66.

In the following there will be explained the control unit of the present embodiment.

The above-mentioned detectors 44, 50, 66 and the detectors 56 connected to the adder 57 are connected to a wave form processor 70 respectively through amplifiers 68. The wave form processor 70, for obtaining information for alignment from input data, receives pulse signals from an interferometer 72 for detecting the position of the wafer stage 22 by means of the movable mirror 39 fixed on the stage 22.

The output of the wave form processor 70 is supplied to a control unit 74, which receives the positional information from the above-mentioned interferometer 72 and supplies a stage driving motor 76 with a control signal.

In the following there will be given an explanation on the function of the entire embodiment, while making reference to FIGS. 4 and 5.

The light beam LA of the exposing wavelength and the aligning light LB of different wavelength travel the same path after the dichroic mirror 28, and illuminate the reticle R. In this state, the light beam LA is focused as a sheet-shaped spot on the surface B1 of the reticle R. Also the aligning light LB is focused, by the function of the double focus element 38 and the objective lens 40, as a sheet-shaped spot in two positions on the surfaces B1 and A1.

Both light beams focused o the plane B1 illuminate the reticle mark RM on the reticle R, and scan the reticle mark RM by the function of the scanner 30 positioned at the pupil position in the light path leading to the plane B1. Among the detection lights obtained by scanning the reticle mark RM, that obtained from the light beam LA is received by the detector 44 through the above-explained light path, while that obtained from the aligning light LB is received by the detectors 56.

Figure 4:
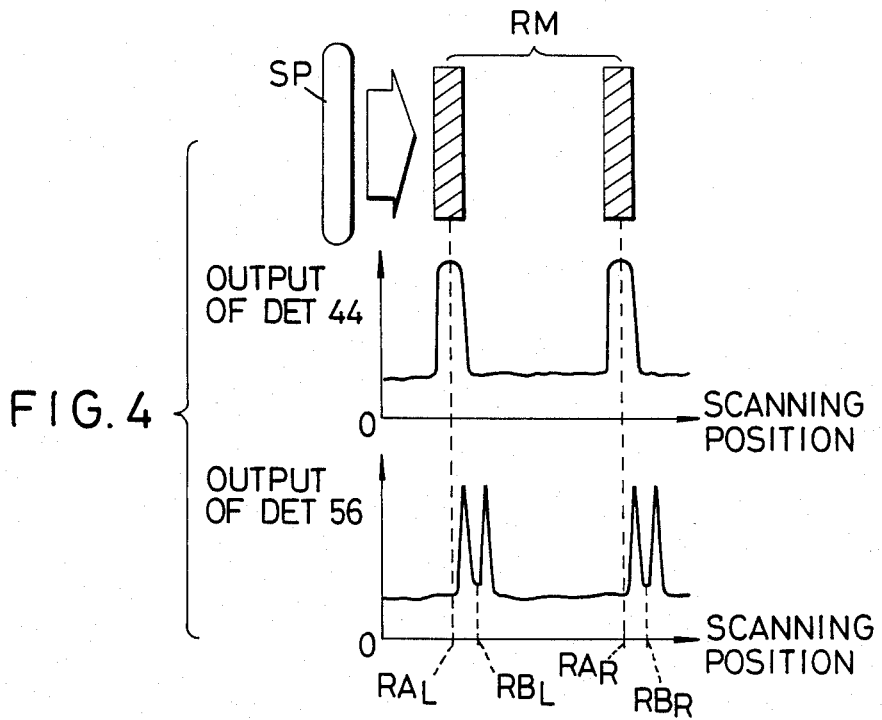
FIG. 4 is a chart showing the detection output obtained by scanning a reticle mark with a light spot.

FIG. 4 illustrates the relationship between the light spot SP of the light beam LA or the aligning light LB and the reticle mark RM, and the relationship between the scanning position and the output of the detectors 4, 56 generated by the scanning of the reticle mark RM with the light spot.

Then the light beams transmitted through the reticle R illuminate the wafer W through the projection lens 20. In this state the light beam LA is focused on the surface A2 of the wafer W, and the aligning light LB which has been focused on a plane A1 above the reticle R is focused also on the surface A2.

In this state the wafer stage 22 is moved by a servo motor 76 in such a manner that the fiducial mark FM comes close to the focusing position of said light beams, so that the reticle mark RM is scanned by the light beams by means of the function of the scanner 30, in the same manner as and simultaneously with the scanning of the reticle R. Among the detection lights from the fiducial mark FM, that obtained from the light beam LA is received by the detector 50 while that obtained from the aligning light LB is received by the detector 66.

Figure 5:
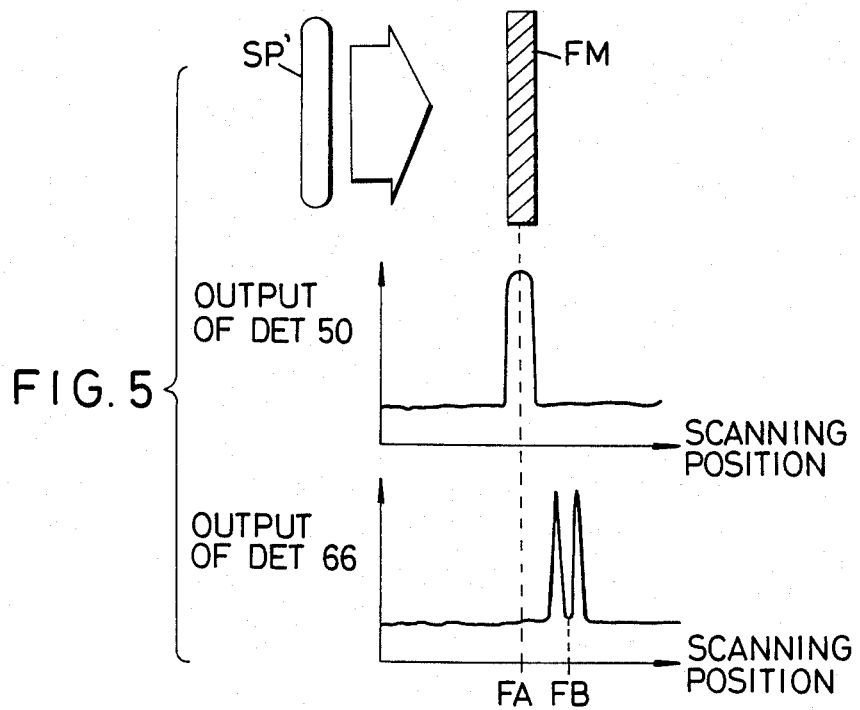
FIG. 5 is a chart showing the detection output obtained by scanning a fiducial mark with a light spot.

FIG. 5 illustrates the positional relationship between the light spot SP' formed on the focal plane of the projection lens 20 and the fiducial mark FM, and the relationship between the scanning position and the output of the detectors 50, 66 obtained by scanning of the fiducial mark FM with the light spot SP', in a similar manner as in FIG. 4.

As shown in FIG. 4, $RA_L$ and $RA_R$ respectively indicate the left and right positions of the reticle mark RM detected by the light beam LA, and $RB_L$ and $RB_R$ indicate the left and right positions detected by the aligning light LB. Also as shown in FIG. 5, FA and FB respectively indicate the position of the fudicial mark FM detected by the light beam LA and the aligning light LB. Also $RB_L - RA_L$ is represented by $\Delta R_L$, and $RB_R - RA_R$ is represented by $\Delta R_R$. The wave form processor 70 determines the error between the light of exposing wavelength and that of different wavelength on the wafer W according to a formula:

$$\frac{(\Delta R_L + \Delta R_R)}{2} - (FB - FA)$$

and the obtained result is supplied to the control unit 74.

Then the alignment operation is conducted with the aligning light LB with compensation of thus determined error, and the projection exposure is subsequently executed.

In the first embodiment explained above, the baseline measurement can be achieved with a high precision, independently for example from vibration of the interferometer 72 of the wafer stage 22 caused by the servo motor 76, since the reticle mark R and the fiducial mark FM are scanned with two light spots at the same time and at almost same positions. Also the measuring time is shortened since the baseline measurement can be achieved with a single scanning.

The foregoing embodiment employs the double focus element 38, but, if the wavelength of the aligning light LB is close to that of the exposing light $LA_0$, the correction of color aberration of the objective lens 40 may be utilized instead of said double focus element 38.

Figure 6:
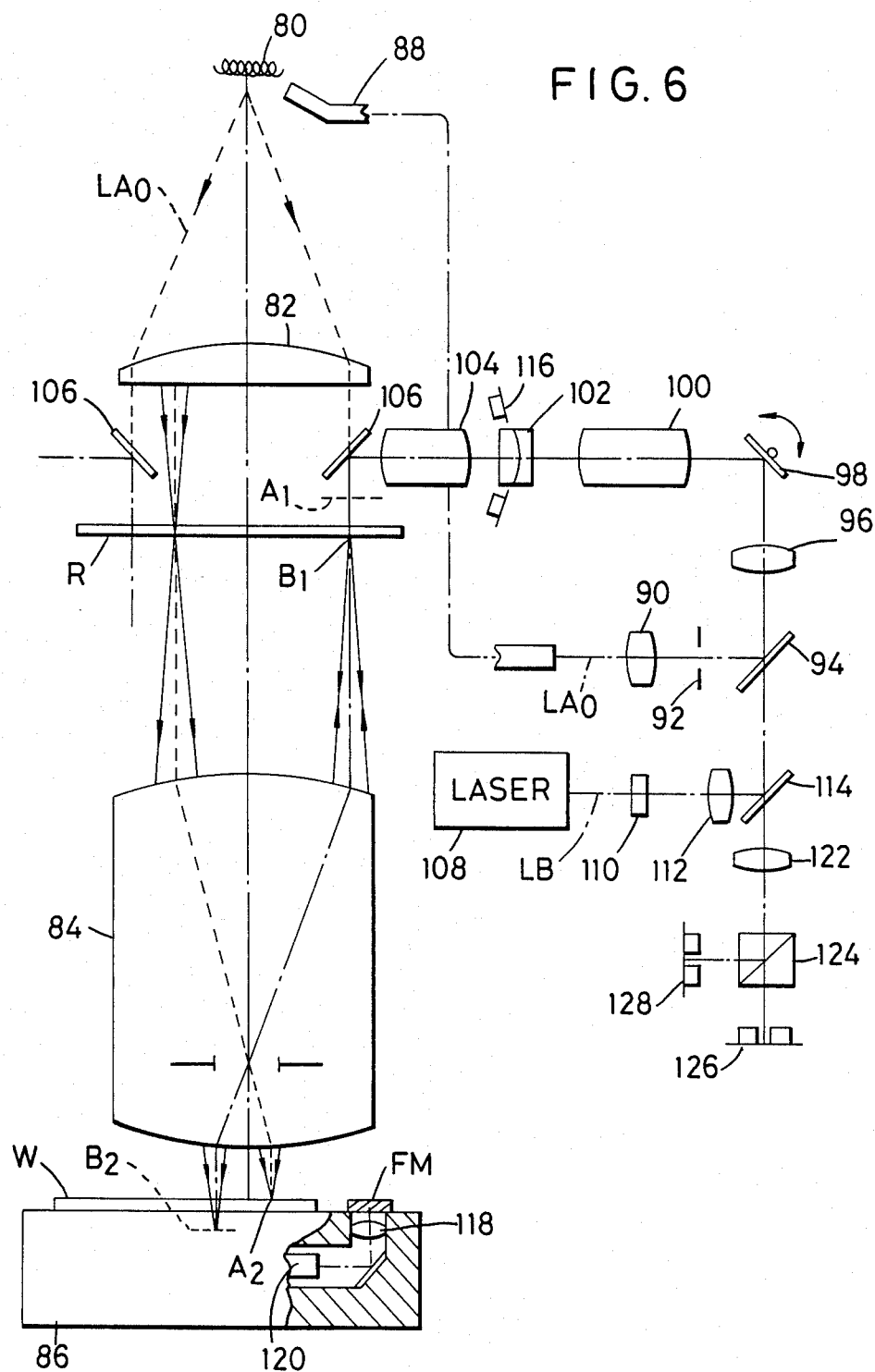
FIG. 6 is a schematic view of an apparatus constituting a second embodiment of the present invention.

FIG. 6 illustrates the optical structure of a second embodiment of the present invention.

The exposing system is constructed as follows. A light beam $LA_0$, for example of G-line, from an exposing light source 80 is transmitted through a condenser lens 82 and enters a reticle R, thus projecting a circuit pattern thereof onto a wafer W placed on a wafer stage 86 through a projection lens 84 which is constructed telecentric on both sides.

Also the light $LA_0$ emitted from the light source 80 and guided by an optical fiber 88 is transmitted through a lens 90 and a slit 92, then reflected by a dichroic mirror 94, transmitted through a lens 96 and enters a scanner mirror 98 placed conjugate to the pupil. The light through the optical fiber 88 can be arbitrarily intercepted for example by an unrepresented shutter. The scanner mirror 98 is capable of moving the reflected light as a light spot at the focus position, in the same manner as the scanner 30 in the first embodiment.

The light beam $LA_0$ entering the scanner mirror 98 is reflected thereby, then transmitted through a relay system 100, a double focus element 102 and an objective lens 104, further reflected by a movable mirror 106 and illuminates the reticle R. As in the first embodiment, the double focus element 102 is so constructed as to show different refractive indexes for different directions of polarization, and the objective lens 104 is one whose chromatic aberration has been corrected for two wavelengths of the light beam $LA_0$ and of an aligning light LB to be explained later. The movable mirror 106 is adapted to move to a position not intercepting the exposing light beam $LA_0$ at the exposure operation.

The exposing light beam $LA_0$ transmitted through the reticle R enters the wafer W through a projection lens 84, and is focused on a surface B1 of the reticle R and a surface A2 of the wafer. As in the first embodiment, a reticle mark RM for alignment (not shown) is formed on the reticle R, and a fiducial mark FM is formed at a suitable corner of the wafer stage 22 at a position corresponding to the surface of the wafer W.

The detection light generated from the reticle mark RM illuminated by the light beam $LA_0$ is reflected by the movable mirror 106, then transmitted through an objective lens 104 and enters detectors 116.

On the other hand, the light beam $LA_0$ which has been transmitted through the glass of the reticle R and illuminated the fiducial mark FM of the wafer stage 86 enters an aperture thereof, then is transmitted through a condenser lens 118 and is received by a photomultiplier 20. Aligning light LB, emitted from an argon laser source 108 and having a wavelength different from the exposing wavelength, is transmitted through a cylindrical lens 110 and a lens 112, then reflected by a beam splitter 144, transmitted through a dichroic mirror 94 and enters the wafer W through a light path same as that of the light beam $LA_0$. As in the first embodiment, the aligning light LB is focused, by the function of the double focus element 102 and the objective lens 104, at two planes A1, B1, and again focused at the planes A2, B2 which are respectively conjugate with said planes A1, B1.

The detection light generated from the reticle mark RM illuminated by the aligning light LB is reflected by the movable mirror 106, then transmitted through the objective lens 104 and received by detectors 116. Also satisfactory information can be obtained by guiding the detection light from the reticle mark RM to another detector through a light path explained below. In this case the detection light returns the light path of the incident light, then is transmitted by the beam splitter 114, a lens 122 and a polarizing beam splitter 124 and received by detectors 126.

On the other hand, the detection light from the fiducial mark FM returns the light path of the incident light, then is transmitted through the beam splitter 114 and the lens 122, reflected by the polarizing beam splitter 124 and received by detectors 128 positioned conjugate with the pupil.

In the above-explained structure, the lenses 90 and 96 constitute a first lens system, while the lenses 112 and 122 constitute a second lens system, and the first and second lens systems constitute a relay system of the pupil image plane.

The control method and function of the above-mentioned second embodiment are similar to those of the first embodiment and will not, therefore, be explained further.

Different from the first embodiment, the second embodiment is unable to detect the marks during the exposure operation, but it can be easily adaptable to the conventional apparatus.

In the second embodiment, the slit 92 may be replaced by pinhole.

The present invention is not limited to the foregoing two embodiments but is subject to various modifications to achieve similar effects

I claim:
1. A projection exposure apparatus comprising:
an imaging optical system for projecting the image of an object placed on a first plane onto a second plane, wherein said first and second planes are mutually conjugate for a first wavelength with respect to said imaging optical system;
first and second alignment mark means respectively formed on said first and second planes;
means for supplying a first radiation beam of said first wavelength;
means for supplying a second radiation beam of a second wavelength different from said first wavelength;
optical means for focusing, through a common light path, said first and second radiation beams on said first plane in the vicinity of said first alignment mark means, and further focusing said beams through said imaging optical system on said second plane in the vicinity of said second alignment mark means; and
deflection means for simultaneously varying the direction of said first and second radiation beams in such a manner that said first and second radiation beams scan said first and second alignment mark means.

2. A projection exposure apparatus according to claim 1, wherein said deflection means is provided on said common light path.

3. A projection exposure apparatus according to claim 1, wherein said optical means comprises multiple focus optical means for focusing a part of said second radiation beam onto said first plane and another part of said second radiation beam onto said second plane.

4. A projection exposure apparatus according to claim 1, further comprising alignment means for determining the relative positions of said first and second alignment mark means, based on said first and second radiation beams illuminating said first and second alignment mark means.

* * * * *